United States Patent [19]

Ishiyama

[11] Patent Number: 5,313,367
[45] Date of Patent: May 17, 1994

[54] SEMICONDUCTOR DEVICE HAVING A MULTILAYER INTERCONNECTION STRUCTURE

[75] Inventor: Hisanobu Ishiyama, Suwa, Japan

[73] Assignee: Seiko Epson Corporation, Tokyo, Japan

[21] Appl. No.: 836,285

[22] PCT Filed: Jun. 11, 1991

[86] PCT No.: PCT/JP91/00786

§ 371 Date: Apr. 21, 1992

§ 102(e) Date: Apr. 21, 1992

[87] PCT Pub. No.: WO92/00603

PCT Pub. Date: Jan. 9, 1992

[30] Foreign Application Priority Data

Jun. 26, 1990 [JP] Japan .................. 2-167371

[51] Int. Cl.⁵ .................. H01R 9/00; H01R 43/00
[52] U.S. Cl. .................. 361/772; 29/827; 228/180.22; 257/735; 257/736; 257/777; 361/760; 361/761; 361/773; 439/69
[58] Field of Search .................. 29/827; 174/52.4; 228/180.2, 180.22; 257/668, 669, 723, 724, 777, 778, 735, 736; 361/396, 400, 401, 421, 760, 761, 762, 767, 768, 772, 773, 774, 807, 808; 439/68, 69; 437/182, 203, 205

[56] References Cited

U.S. PATENT DOCUMENTS

| 4,051,274 | 9/1977 | Hata et al. | 427/172 |
| 4,912,547 | 3/1990 | Bilowith et al. | 257/778 |
| 5,021,866 | 6/1991 | Sudo et al. | 257/669 |

FOREIGN PATENT DOCUMENTS

| 343400 | 11/1989 | European Pat. Off. | |
| 0461639 | 12/1991 | European Pat. Off. | 257/777 |
| 0474224 | 3/1992 | European Pat. Off. | 257/777 |
| 52-84969 | 7/1977 | Japan . | |
| 55-6852 | 1/1980 | Japan . | |
| 58-159361 | 9/1983 | Japan | 257/777 |
| 60-46040 | 3/1985 | Japan . | |
| 60-80232 | 5/1985 | Japan | 257/777 |
| 61-225825 | 10/1986 | Japan | 437/205 |
| 62-67828 | 3/1987 | Japan . | |
| 62-158339 | 7/1987 | Japan | 257/777 |
| 63-52461 | 3/1988 | Japan | 257/777 |
| 63-164229 | 7/1988 | Japan . | |
| 1-108934 | 7/1989 | Japan . | |
| 1-303730 | 12/1989 | Japan | 257/777 |
| 2-142151 | 5/1990 | Japan | 257/724 |

OTHER PUBLICATIONS

IBM Technical Disclosure Bulletin "Method for Manufacturing a Low-Cost Power Regulator Card" vol. 32, No. 7, Dec. 1989.

Primary Examiner—Leo P. Picard
Assistant Examiner—Donald A. Sparks
Attorney, Agent, or Firm—Eric B. Janofsky

[57] ABSTRACT

Actualized are fingers through which a semiconductor integrated circuit including high density electrode strings can be easily safely mounted on a circuit substrate in the same manner with the prior art. A conductor pattern capable of improving a packaging density of the integrated circuit including the fingers is actualized. The fingers are therefore configured using the multi-layered conductor pattern. The conductor pattern is multi-layered, i.e., consists of conductive layers and an insulating layer for separating these conductive layers. In addition to a wiring pattern serving as fingers for connecting an integrated circuit to a packaging substrate, an electrification path for interlayer connections is also formed in a thickness direction. The circuit substrate exhibiting a high packaging density can be actualized.

18 Claims, 11 Drawing Sheets

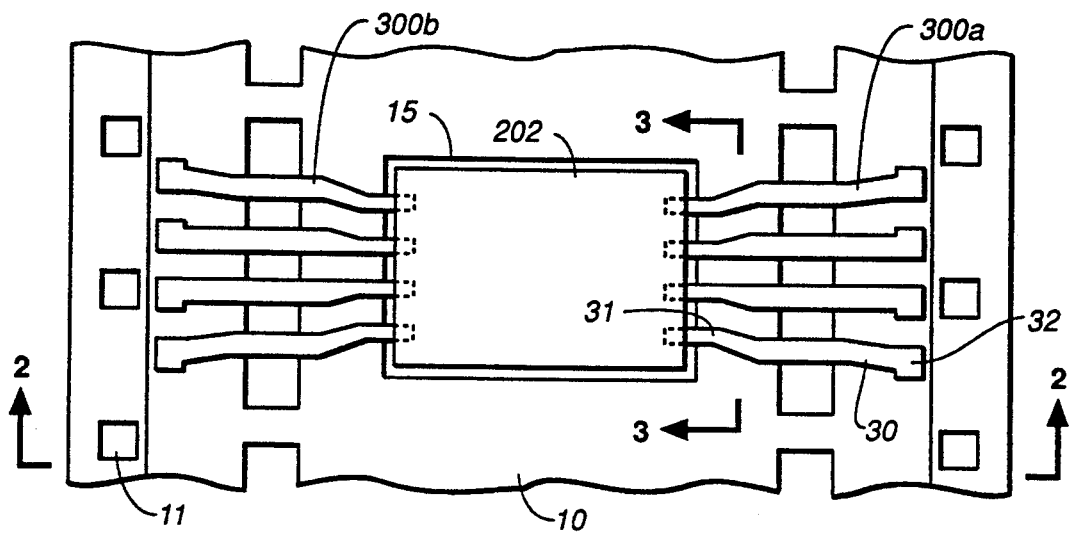
FIG._1
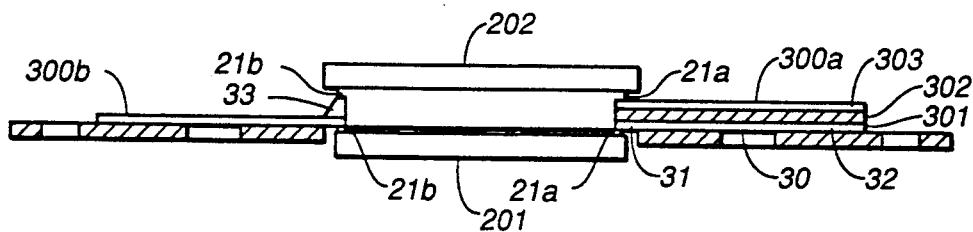
FIG._2
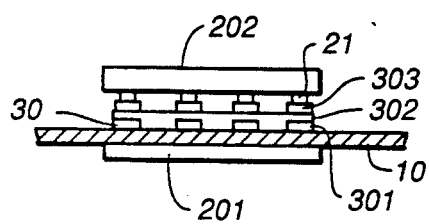
FIG._3

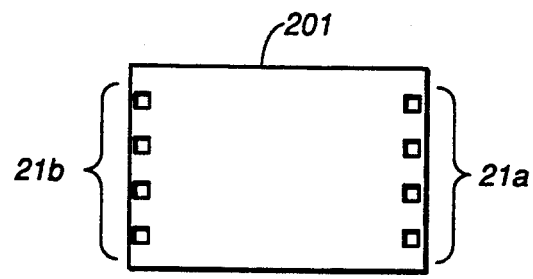
FIG._4
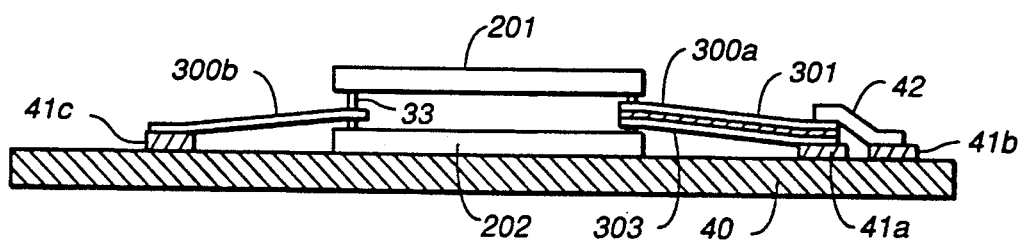
FIG._5
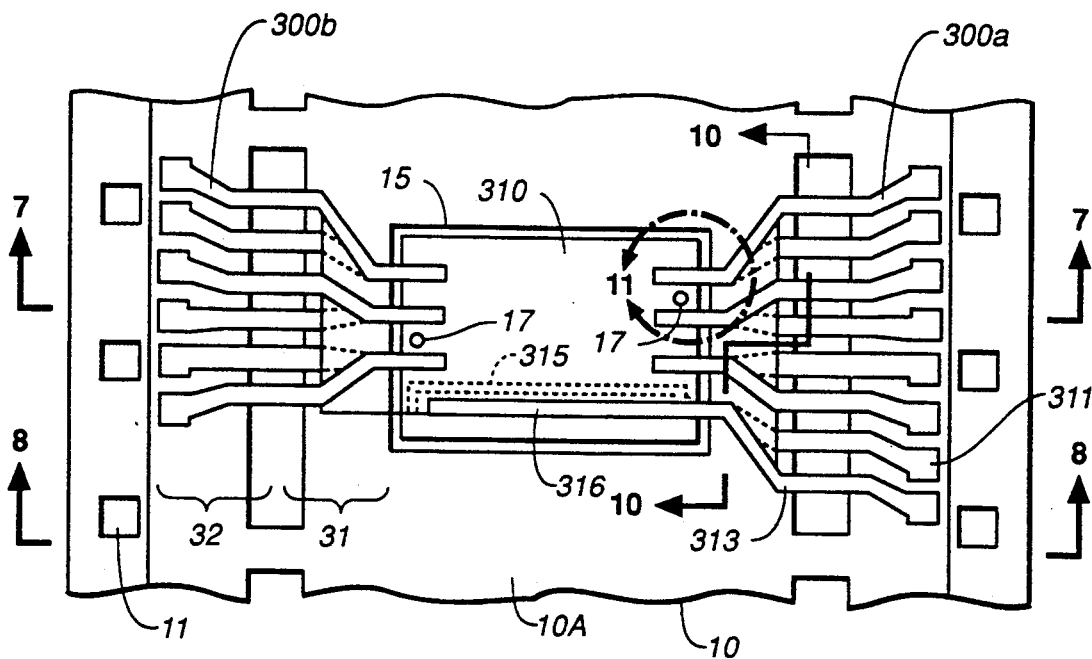
FIG._6

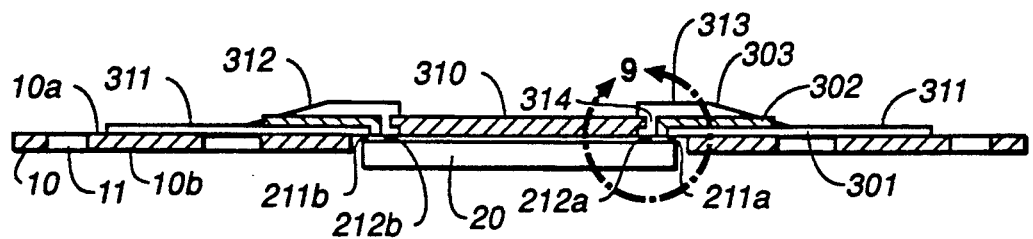
FIG._7
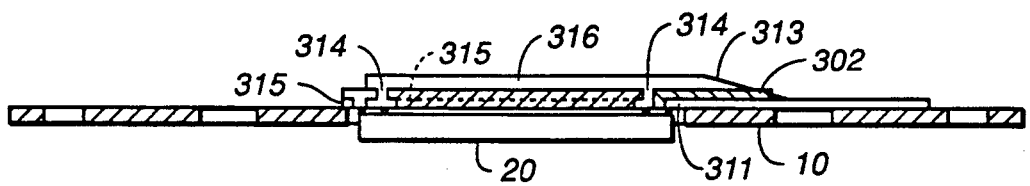
FIG._8
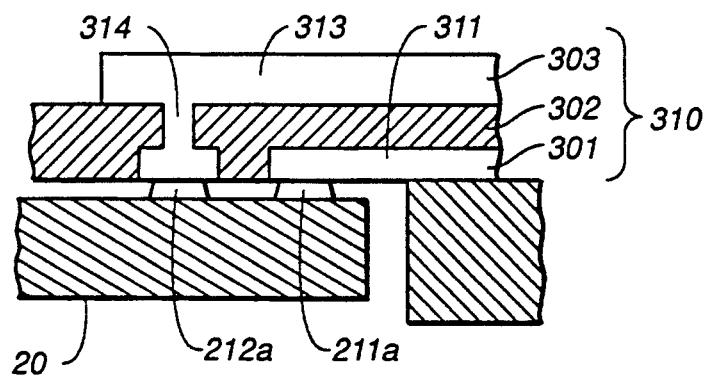
FIG._9
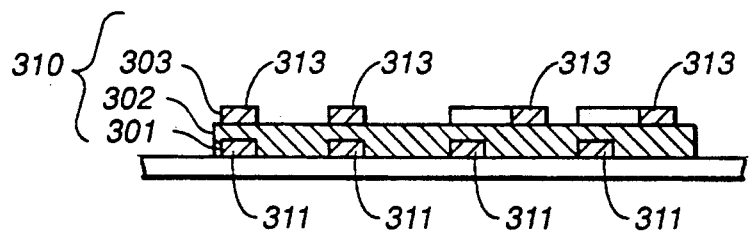
FIG._10

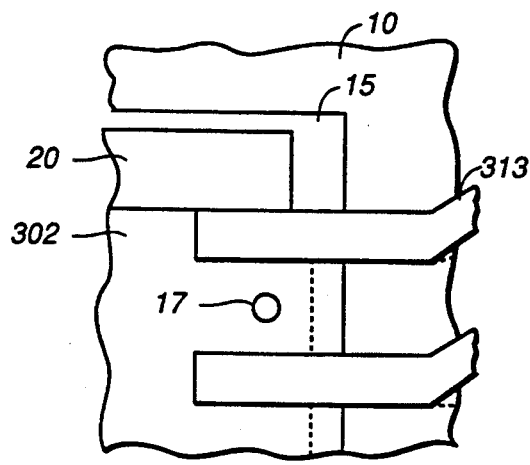
FIG._11
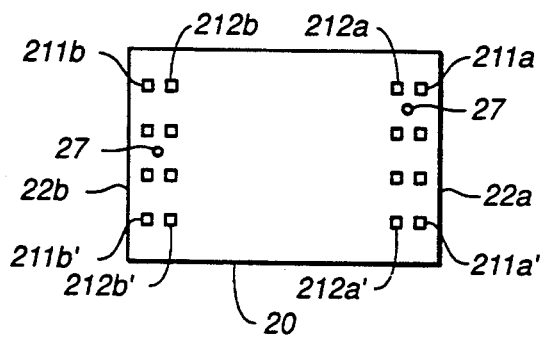
FIG._12
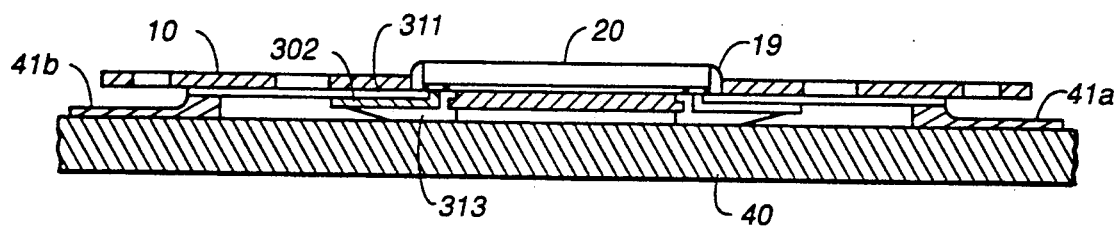
FIG._13

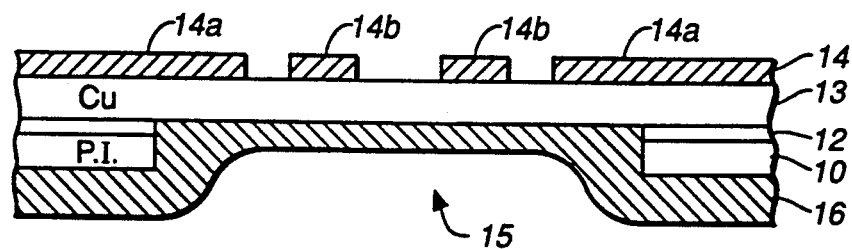
FIG._14A
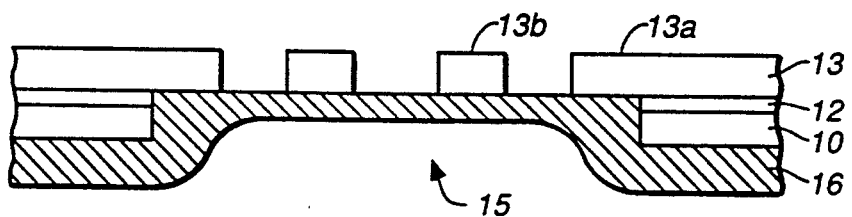
FIG._14B
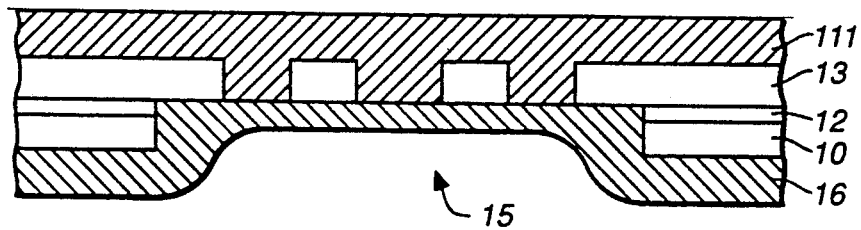
FIG._14C
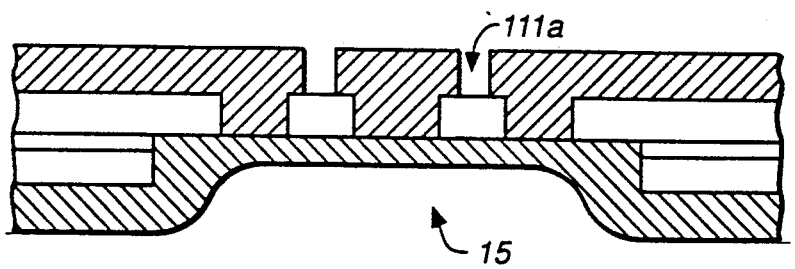
FIG._14D

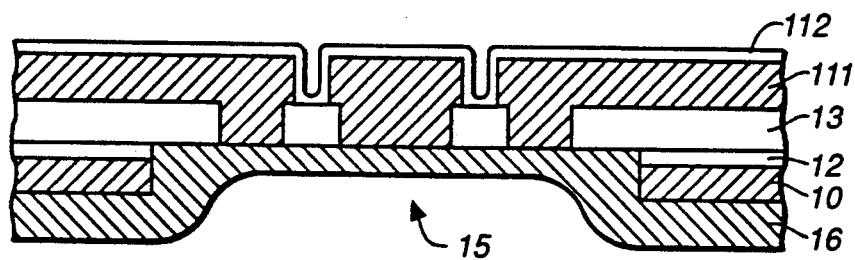
FIG._15A
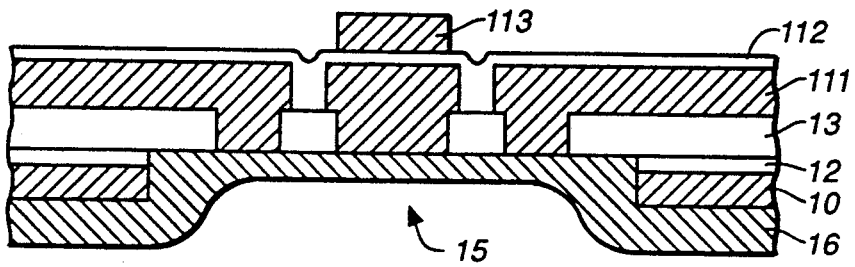
FIG._15B
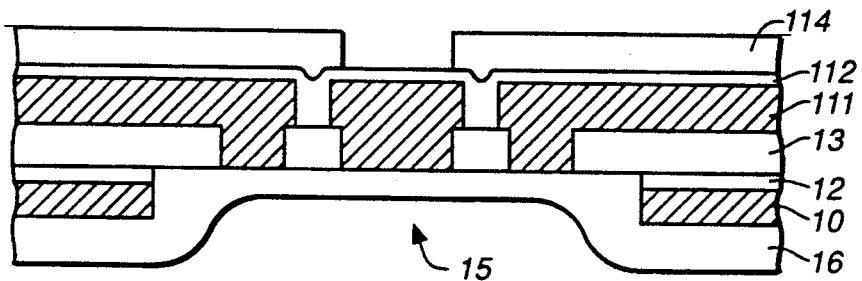
FIG._15C
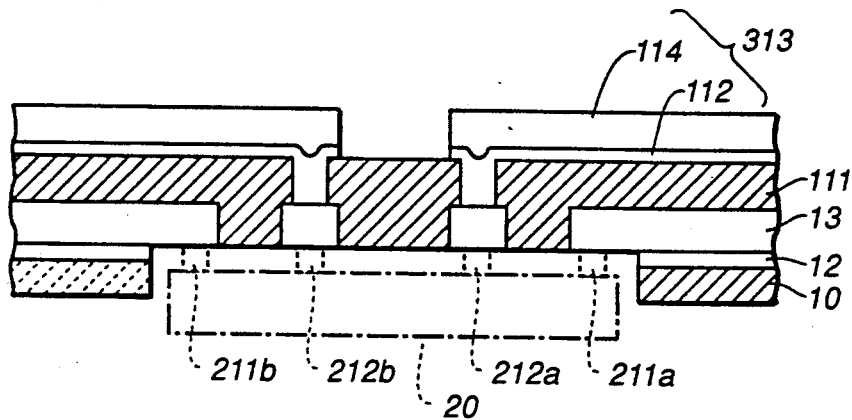
FIG._15D

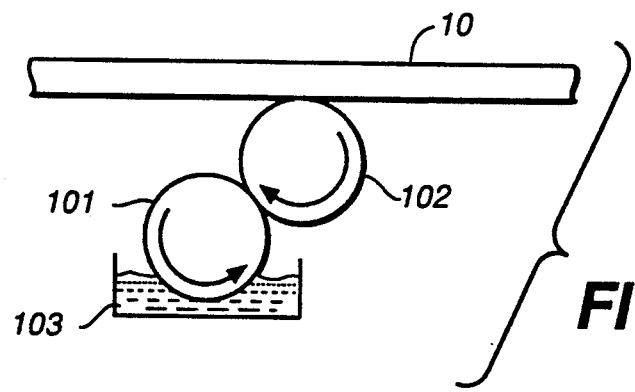
FIG._16
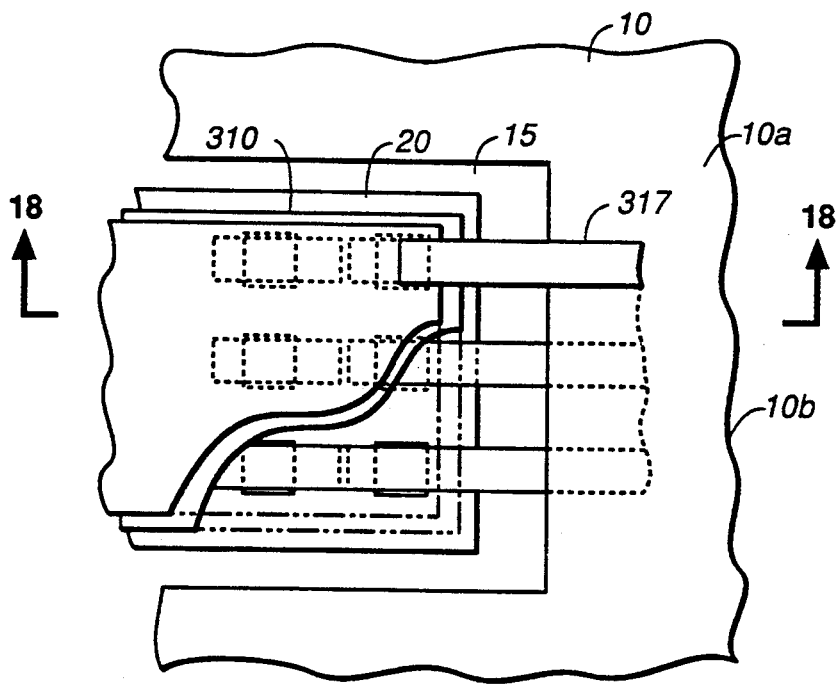
FIG._17
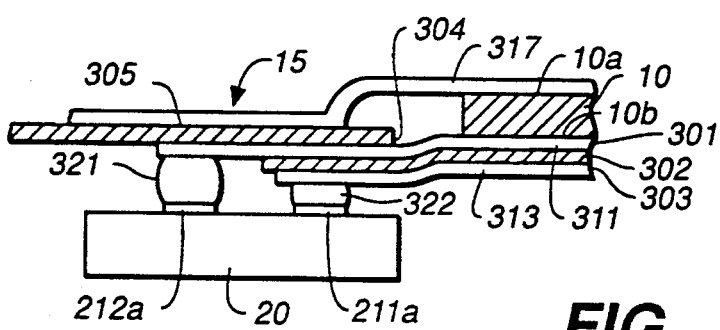
FIG._18

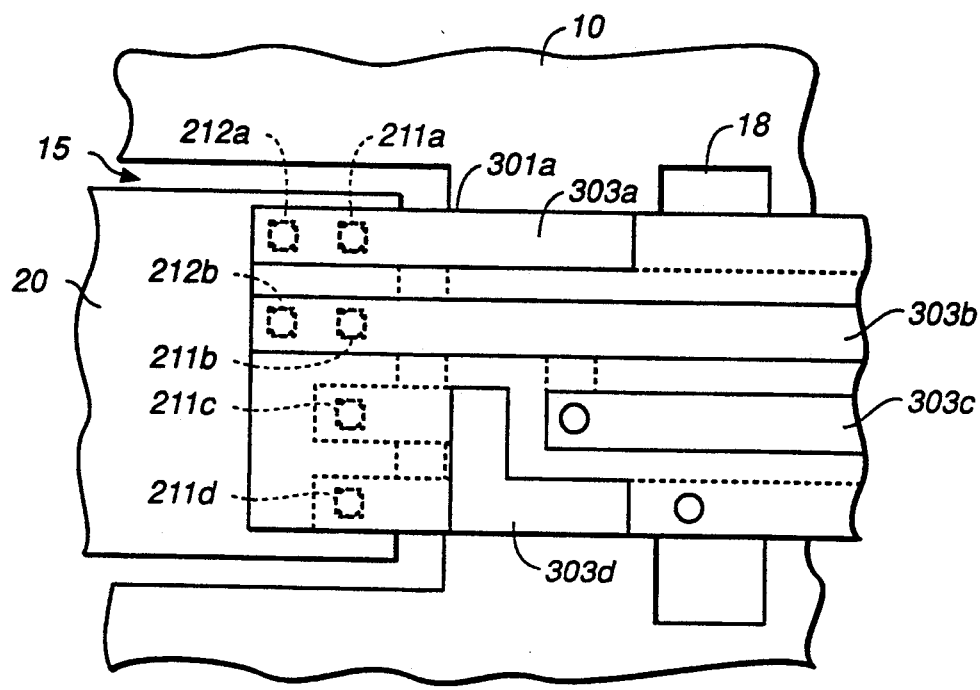
FIG._19
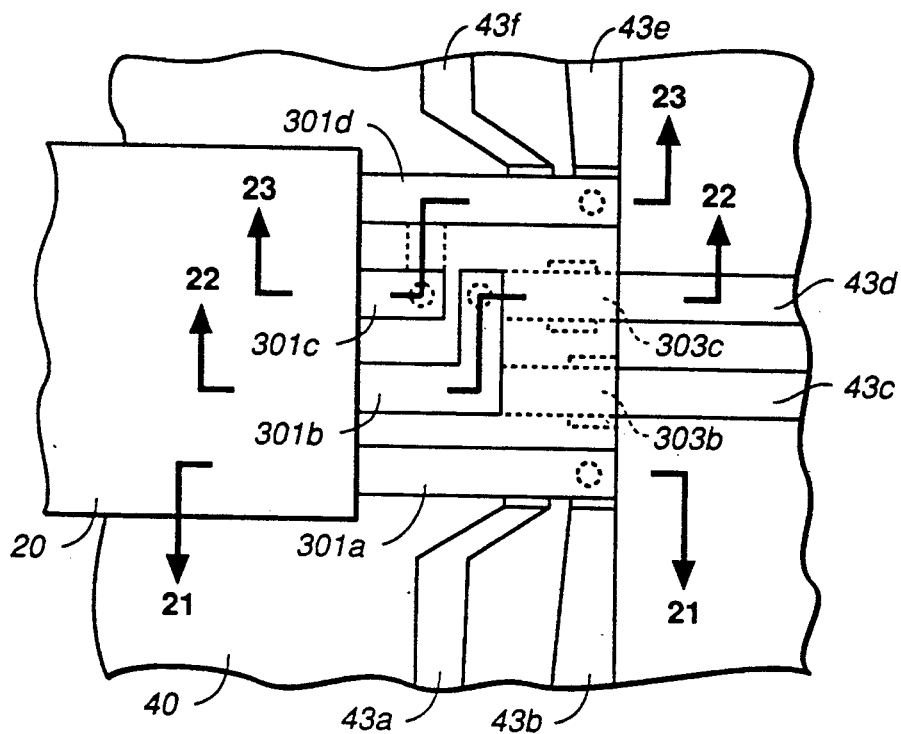
FIG._20

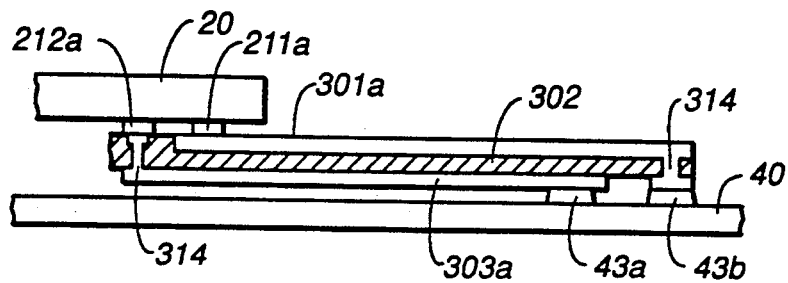
FIG._21
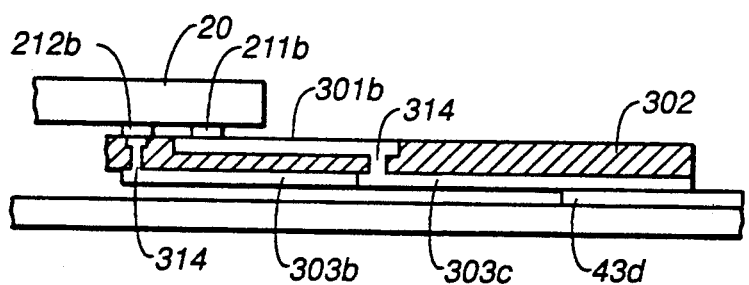
FIG._22
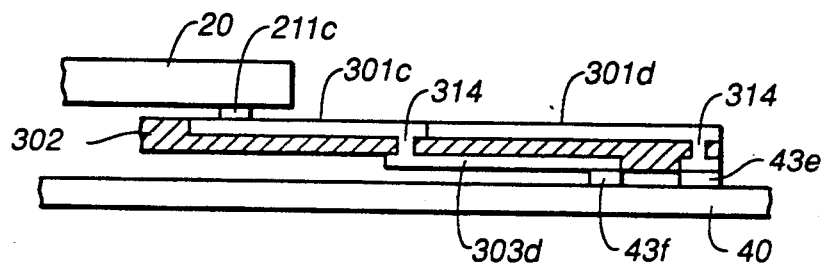
FIG._23

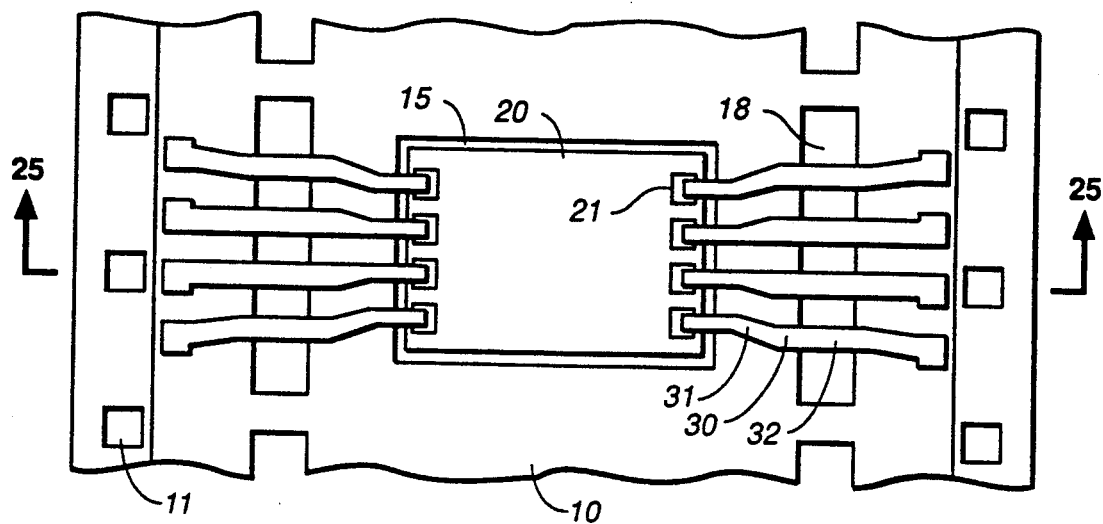
FIG._24
(PRIOR ART)
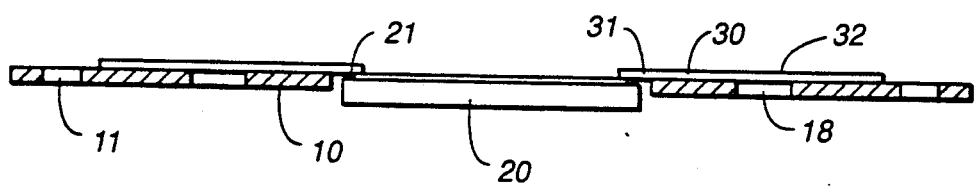
FIG._25
(PRIOR ART)

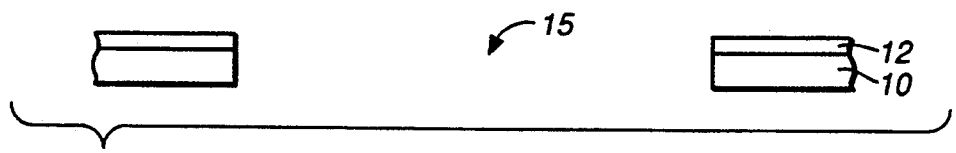
FIG._26A (PRIOR ART)
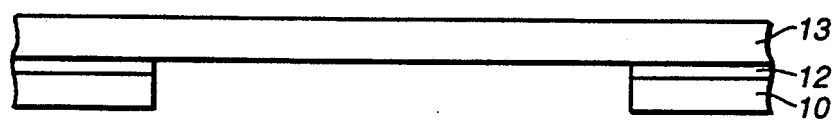
FIG._26B (PRIOR ART)
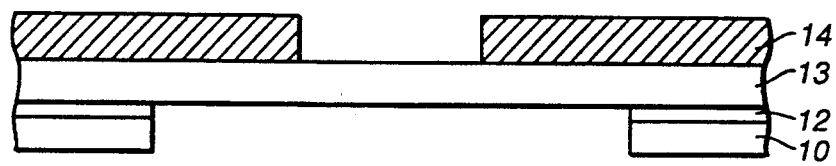
FIG._26C (PRIOR ART)
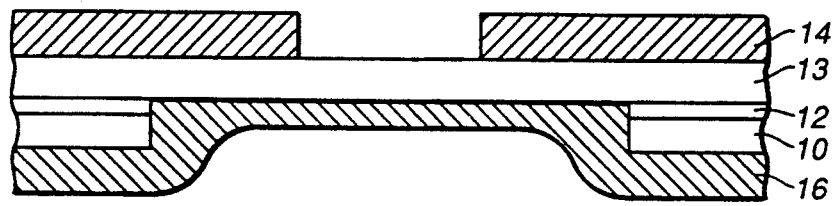
FIG._26D (PRIOR ART)
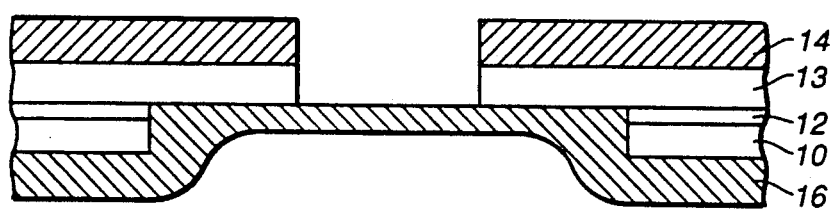
FIG._26E (PRIOR ART)

SEMICONDUCTOR DEVICE HAVING A MULTILAYER INTERCONNECTION STRUCTURE

BACKGROUND OF THE INVENTION

1. Technical Field

The present invention is directed generally to a lead structure for use in semiconductor device packaging, and more particularly, to a lead or finger structure for a semiconductor device packaged in a tape carrier system.

2. Related Technical Art

FIGS. 24 and 25 show how leads or fingers are mounted on a semiconductor integrated substrate which is to be packaged in a conventional tape carrier system. In this semiconductor device, a device hole 15 is formed at the center of an elongated polyimide tape 10 including sprocket holes 11. An IC chip 20 is inserted in the device hole 15. Electrodes 21 of the chip 20 are connected to one end of fingers 30, i.e. inner lead parts 31 formed on the surface of the polyimide tape 10. Tips of outer lead parts 32, viz., the other ends of the fingers 30, are cut outer lead holes 18 and connected to electrodes of the substrate.

A method of manufacturing the above-described tape carrier is demonstrated in FIGS. 26A-26B. The following is a general description of the respective steps.

Step 1: The device hole 15 in which the IC chip is mounted is punched out at the center of the polyimide tape 10 having its upper surface formed with a bonding layer 12. The sprocket holes 11 and the outer lead holes 18 are punched out along the circumference thereof (FIG. 26A.

Step 2: A copper foil 13 is laminated on the bonding layer 12 (FIG. 26B).

Step 3: A resist 14 is coated onto the copper foil 13, and thereafter the resist 14 is removed while the finger parts are left using lithography (FIG. 26C).

Step 4: A protective resist 16 is coated on a rear face of the polyimide tape 10 to prevent etching from the rear face (FIG. 26D).

Step 5: Etching effected on the polyimide tape 10 to form the finger parts (FIG. 26E).

Step 6: The resists 14 and 16 are removed.

Considering an etching limit, decline in lead strength, or alignment accuracy, the pitch of the fingers formed by the above-mentioned method is limited to approximately 80 Pm. On the other hand, with advancement toward a hyperfine semiconductor integrated circuit and improvement in integration rates thereof, inputs and outputs are increased, and the circuit is multi-pinned. Under such circumstances, electrode density on the semiconductor integrated substrate also increases. Hence, fingers are required which are capable of corresponding to the high density of electrodes and causing less inconvenience such as deformation and the like.

The circuit substrate mounted with the semiconductor circuit is also required to be miniaturized. It is, therefore, required that a multiplicity of integrated circuits be mounted in a limited area. The conventional finger structure, however, presents difficulty in reducing the area occupied by the fingers. This is because the area occupied by the fingers increases with the advancement of multi-pinning. Besides, the conventional finger shows a one-to-one correspondence to the integrated circuit, whereby a wide area is needed for the fingers for integrated circuits.

The present invention, which has been made in the light of such problems, aims at reducing the area occupied by the fingers by cubically arranging the fingers, providing a construction capable of corresponding to the multi-pinned integrated circuit, and further improving the packaging density by simultaneously mounting the plurality of integrated circuits.

3. Disclosure of the Invention

To obviate the problems described above, in a semiconductor device according to this invention, a multi-layered conductive pattern unit including at least a single insulating layer and plural conductive layers is mounted on a semiconductor integrated substrate. Formed in a part of the conductive layer is a wiring pattern having its one end connected to electrodes of the semiconductor substrate and the other end extending outside. The cubic wiring pattern is thus configured.

The conductive pattern unit including the cubically configured wiring pattern is mounted on the semiconductor integrated substrate. The integrated substrate is connected to the wiring pattern of a single layer of the multi-layered structure. Another integrated substrate is connected to the wiring pattern of another layer. Namely, a plurality of semiconductor integrated substrates are mounted with this conductive pattern unit being sandwiched in between. These substrates are also connectable through a pattern formed in the conductive layers within the multi-layered conductive pattern unit.

In a semiconductor device comprising a film-like flexible substrate formed with a device hole and at least one semiconductor integrated substrate mounted in the device hole, the same conductive pattern unit as the above is mounted on this semiconductor integrated substrate.

When the wiring patterns are formed in a plurality of conductive layers of the conductive pattern unit, a plurality of wiring patterns can be laminated by use of a mask pattern assuming the same configuration. When single-layered electrode strings are formed, the connections to the circuit substrate are facilitated by the other ends, extending outside, of the wiring patterns.

Besides, it is effective to form an electrification path in a thickness-wise direction of the conductive pattern unit. The electrodes of the semiconductor substrate are connectable to the wiring pattern through this electrification path. This electrification path is provided in the form of a through-hole or a bump.

The plurality of layers constituting the conductive pattern unit are connectable to each other through the electrification path formed in the thickness-wise direction of the conductive pattern unit. Further, the multi-layered wiring patterns can be connected to a multiplicity of electrodes arranged in a plurality of rows on the integrated substrate and the packaging substrate as well.

The insulating layer may be formed of polyimide. A polyimide tape is usable as the flexible substrate given above.

One method of manufacturing such a semiconductor device comprises the step of forming a conductor pattern unit on a flexible substrate by photolithography. In this conductor pattern forming step, an insulating layer is formed based on a roll coat method.

BRIEF DESCRIPTION OF THE DRAWINGS

FIG. 1 is an outline diagram schematically illustrating a semiconductor device in an embodiment 1 of this invention;

FIG. 2 is a sectional view taken substantially along the line 2—2 of FIG. 1, illustrating the same semiconductor device;

FIG. 3 is a sectional view taken substantially along the line 3—3 of FIG. 1, illustrating the same semiconductor device;

FIG. 4 is an outline diagram depicting an IC chip used for the semiconductor device shown in FIG. 1;

FIG. 5 is a sectional view showing how the semiconductor device is mounted in a circuit substrate;

FIG. 6 is an outline diagram schematically illustrating the semiconductor device in an embodiment 2 of this invention;

FIG. 7 is a sectional view taken substantially along the line 7—7 of FIG. 6, showing the same semiconductor device;

FIG. 8 is a sectional view taken substantially along the line 8—8 of FIG. 6, showing the same semiconductor device;

FIG. 9 is a sectional view fully depicting a portion, indicated by 9, of the semiconductor device illustrated in FIG. 7;

FIG. 10 is a sectional view taken substantially along the line 10—10 of FIG. 6, showing the same semiconductor device;

FIG. 11 is an explanatory view fully depicting a portion, indicated by 11, of the semiconductor device of FIG. 6;

FIG. 12 is an outline diagram illustrating an IC chip used for the semiconductor device of FIG. 6;

FIG. 13 is a sectional view showing how the semiconductor device illustrated in FIG. 6 is mounted on the circuit substrate;

FIGS. 14A–14D are diagrams of assistance in steps 4 to 7 of manufacturing the semiconductor device of FIG. 6;

FIGS. 15A–15D are diagrams of assitance in explaining steps 8 to 11 of manufacturing the semiconductor device of FIG. 6;

FIG. 16 is a diagram of assistance in explaining a roll coat method;

FIG. 17 is an explanatory view illustrating the semiconductor device in an embodiment 3 of this invention;

FIG. 18 is a sectional view taken substantially along the line 18—18 of FIG. 17, showing the same semiconductor device;

FIG. 19 is an explanatory view illustrating the semiconductor device in an embodiment 4 of this invention;

FIG. 20 is an explanatory view showing how the semiconductor device shown in FIG. 19 is mounted on the substrate;

FIG. 21 is a sectional view taken substantially along the line 21—21 of FIG. 20;

FIG. 22 is a sectional view taken substantially along the line 22—22 of PIG. 20;

FIG. 23 is a sectional view taken substantially along the line 23—23 of FIG. 20;

FIG. 24 is an outline diagram schematically illustrating a conventional semiconductor device;

FIG. 25 is a sectional view taken substantially along the line 25—25 of FIG. 24, showing the same semiconductor device; and FIGS. 26A–26E are diagrams of assistance in explaining the steps of manufacturing the semiconductor device illustrated in FIG. 24.

BEST MODE FOR CARRYING OUT THE INVENTION

The best mode for carrying out the present invention will hereinafter be described with reference to the accompanying drawing.

EMBODIMENT 11

FIGS. 1 to 5 in combination show a semiconductor device having a conductive pattern in a first embodiment. The semiconductor device in this embodiment is structured such that two IC chips 201 and 202 are, as illustrated in FIGS. I and 2, connected to two sets of finger units 300a and 300b formed on a polyimide tape 10. The finger unit 300a has a three-layered structure- i.e., it consists of a first copper conductive layer 301, a polyimide insulating layer for covering this conductive layer 301 and a second copper conductive layer 303 formed in this insulating layer. Besides, in this finger unit 300a, as illustrated in FIG. 3 each of the first and second conductive layers 301, 303 consist of four fingers 30. The respective fingers 30 are electrically independent. The finger 30 comprises an inner lead part 31 connected to electrodes 21 of the IC chips 201, 202 and an outer lead part 32 connected to electrodes of a substrate. The top end of the outer lead part 32 expands substantially into a square. The other finger unit 300b is, as in the prior art, based on a single-layered structure of copper, viz., composed of four fingers 30. A bump 33 as high as a thickness of the 3-layered finger unit 300a is formed at the top end of the inner lead part 31.

The two IC chips 201, 202 are attached from both sides, with the two finger units 300a, 300b being sandwiched therebetween. An electrode string 21a of the IC chip 201 is attached from the underside of the finger unit 300a. This electrode string 21a is connected to the first conductive layer 301 of the finger unit 300a by thermocompression. An electrode string 21b of the chip 201 is thermocompression-connected to each inner lead part 31 of the finger unit 300b. An electrode string 21a of the IC chip 202 attached from the upside of the finger units 300a, 300b is connected to each inner lead part 31 of the second conductive layer 303 of the finger unit 300a. Each electrode of the electrode string 21b of the chip 202 is connected to the bump 33 formed at the tip of each inner lead part 31 of the finger unit 300b.

As described above, in the semiconductor device according to this embodiment, the two IC chips 201, 202 are connected with the 3-layered finger unit 300a and the single-layered finger unit 300b being interposed therebetween. The electrode string 21a of each chip is connected to each of the fingers 30 of the first and second conductive layers 301, 303 of the 3-layered finger unit 300a. Individual accessing to each electrode through this finger 30 from the circuit substrate is attained. On the other hand, the electrode string 21b of each chip is connected to each of the fingers 30 of the single layered finger unit 300b. Hence, each finger is common to the two chips 201, 202. For this reason, accessing can be effected from the circuit substrate in common to the two chips via the finger unit 300b. In some IC chips 201, 202 of this type, terminals such as chip selection terminals are arranged in the individually accessible electrode string 21a, and I/O terminals for data are arranged in the common accessible electrode string 21b.

FIG. 5 shows how the semiconductor device of this embodiment is packaged in a circuit substrate 40. In this embodiment, the semiconductor device composed of the chips 201, 202 and the finger units 300a, 300b are formed on a polyimide tape 10 defined as a carrier tape shown in FIG. 1. In a state where the semiconductor device is mounted on this tape 10, the chip 202 is so placed on the circuit substrate 40 so as to confront the substrate 40. Thereafter, the outer lead part 32 of the finger unit is cut off, or alternatively the finger unit is exfoliated from the polyimide tape 10. The tape 10 and the semiconductor device are thereby separated from each other and mounted on the circuit substrate 40. In this instance, each of the fingers of the second conductive layer 303 of the finger unit 300a confronting the substrate 40 is connected to a wire 41a on the substrate 40. Similarly, each of the fingers of the finger unit 300b is connected to a wire 41c. On the other hand, each finger of the first conductive layer 301 of the finger unit 300a which does not confront the substrate 40 is connected to a wire 41b prepared on an outer periphery of 41a using an anisotropic conductive rubber 42.

As discussed above, in the semiconductor device according to this embodiment, the two IC chips can be provided in a region where a single IC chip has hitherto been provided. It is, therefore, possible to improve packaging density on the circuit substrate. Furthermore, data common to the two chips for input and output of data can be connected to the circuit on the substrate via a single finger unit. Hence, it is unnecessary to prepare wires on the circuit substrate for each electrode to which the common data are outputted and inputted. An enhancement of the packaging density is thereby attainable. Thus, a high density circuit substrate can be formed by employing the semiconductor device of this embodiment.

Besides, in this embodiment, chips having the same kind of electrode array are connected. The first and second conductive layers of the finger unit 300a are based on the same wiring pattern. Hence, a multi-layered wiring pattern of a conductor pattern in this embodiment is formed with the aid of a mask pattern where a pattern of a portion corresponding to the finger unit 300a is the same. Moreover, in this embodiment, the finger unit 300b is structured with a single layer. As a matter of course, however, a conductor pattern in which the finger units 300a, 300b are structured by laminates of the same wiring pattern can be formed by repeatedly using the same mask.

Note that in this embodiment, the fingers common to the two chips are configured using the single-layered finger unit, however, accessing to the two chips can be effected by forming an electrification path in a thickness-wise direction of the finger unit in some fingers of the multi-layered finger unit. Accessing individually all the electrodes of the two chips is also attainable with the two finger units being multi-layered. Note that accessing individually the two chips is also, as a matter of course, performed even by the single-layered unit with respect to portions with different electrode arrays.

Additionally, in this embodiment, the semiconductor device is constructed by attaching IC chips of the same type to both ends of the finger unit. Different types of IC chips may also be fitted to both ends of the finger unit. A variety of arrangements are adopted wherein one chip is attached to one side, while a plurality of chips are attached to the other side, and so on.

EMBODIMENT 2

FIGS. 6 through 13 in combination illustrate the semiconductor device in a second embodiment. The semiconductor device in this embodiment is, the same as in embodiment 1, formed on the elongated and flexible carrier tape 10 formed with sprocket holes 11. In this embodiment, a 3-layered conductive pattern 310 is formed across a device hole 15 on an upper surface 10a of tape 10. This conductive layer 310 is, the same as in embodiment 1, composed of the first conductive layer 301, the insulating layer 302, and the second conductive layer 303. According to this embodiment, the finger units 300a, 300b are formed at both ends of this conductive pattern 310. An IC chip 20 is connected via the device hole 15 to the conductor pattern 310 from the direction of rear face 10b of the tape.

FIG. 12 depicts the rear face of the IC chip 20 employed in this embodiment. The IC chip 20 in this embodiment includes electrode strings 211, 212 each arranged in two rows along outer edges 22a, 22b of the chip. Respective fingers 311, configured by the first conductive layer 301, of the finger units 300a, 300b are, as illustrated in FIG. 7, connected to the outer electrode strings 211a, 211b of the chip 20. On the other hand, respective fingers 313, configured by the second conductive layer 303, of the finger units 300a, 300b are connected via a though-hole 314 to the inner electrode strings 212a, 212b of the chip 20. This through-hole 314 is, as depicted in FIG. 9, an electrification path formed in a thickness-wise direction of the conductor pattern 310. The through-hole 314 serves to connect the tips of the fingers 313 configured by the second conductive layer 303 to the inner electrode strings 212a, 212b of the chip 20.

Further, in this embodiment, a common signal is inputted to the lowermost electrodes 211a, 211b and 212a, 212b on the IC chip illustrated in FIG. 12. Namely, the electrodes 211a, 211b disposed at the outer chip edges are, as illustrated in FIGS. 6 and 8, connected by a wiring pattern 315 formed by the first conductive layer 301 of the conductor pattern 310. The electrodes 212a, 212b disposed more inside of the chip, are connected via the through-hole 314 by a wiring pattern 316 formed by the second conductive layer 303.

In the outer lead parts of the finger units 300a, 300b according to this embodiment, connecting the 2-layered fingers 311, 313 individually to wires on the circuit substrate involves the following arrangement. The second layer fingers are bent. The outer lead part 32 of the second layer fingers and the outer lead part 32 of the first layer fingers 311 are disposed alternately. More specifically, in the inner lead parts 31, as shown in the upper left portion of FIG. 10, the second layer fingers 313 are laminated on the first layer fingers 311, with the insulating layer 302 being sandwiched therebetween. From the inner lead part 31 to the outer lead part 32, as shown in the upper right portion of FIG. 10, the second layer fingers 313 are positioned between the first layer fingers 311. For this purpose, the second layer fingers 313 are bent outwardly of the first layer fingers 311. Hence, in the outer lead part 32, the first layer fingers 311 and the second layer fingers 313 are disposed as if they appear to be a single layer in a plane. Besides, the respective fingers do not interfere with each other.

As illustrated in FIG. 11, the semiconductor device of this embodiment prepares a positioning mark hole 17 formed in the finger unit 300 of the conductor pattern 310 in order to surely connect the multi-layered conductor pattern 310, described above, to the electrode strings 211, 212 of the IC chip 20. When connecting the conductor pattern 310 to the chip 20, this hole 17, and a similar mark hole 27 prepared on the IC chip 20, are accurately positioned in a straight line while confirming transmission of laser beams emitted from the rear face of the IC chip 20. The mark 27 prepared on the IC chip may be a reflection mark. A position can be determined using pattern recognition of the mark 27 on the IC chip through the mark hole 17.

FIG. 13 shows a state where the semiconductor device is mounted on the circuit substrate 40. The semiconductor device of this embodiment is mounted on the substrate 40 in such a way that the IC chip 20 inserted in a device hole 15 is fixed to the carrier tape 10 with a mold 19 of a resin or the like. The fingers 311, 313 of the respective layers, which are disposed in a plane on the tape 10, are connected respectively to corresponding wires 41 on the circuit substrate 40. As explained above, in this embodiment, the fingers are connectable to the individual electrodes of a multiplicity of electrode strings arranged in two rows on the IC chip by use of the 3-layered conductor pattern including the insulating layer. Further, these multi-layered fingers are formed to constitute the single-layered electrode string in the outer lead part. The individual electrodes on the IC chip are, as in the case of the conventional chip, connectable to the respective wires on the circuit substrate. As discussed above, inconveniences such as deformation due to a drop in finger strength can be reduced by applying the conductor pattern according to this embodiment both to a chip whose inter-electrode spacing becomes narrower due to a more miniaturized IC chip, and to a chip including a multiplicity of electrode strings. Packaging on the o circuit substrate is attainable with a bonder exhibiting an accuracy identical with the as-spread accuracy. Besides, a power supply or the electrodes to which a common signal is inputted are connectable by use of the conductive layer of the conductor pattern. The numerical quantity of fingers connected to the chip can be reduced. The packaging density can be also improved safely and easily.

Note that in this embodiment the 3-layered conductor pattern is used for two strings of electrodes, but the connections can be attained by using the conductor pattern of this embodiment for three or more strings of electrodes. If the finger density of increases in such a case, a conductor pattern of three or more layers is employed, and, as a matter of course, necessary spacing can be secured.

According to this embodiment, the finger units are formed on both sides of the conductor pattern but may be provided on one side. Besides, each finger unit may constitute an independent conductor pattern. The finger units may, of course, be formed over the entire circumference of the chip. Moreover, a multi-layered conductor pattern may be formed for each finger. A portion for connection to the IC chip body is prepared at a central part of the conductor pattern in this embodiment to strengthen the connection between the conductor pattern and the chip. It is thus possible to restrain an occurrence of inconvenience such as exfoliation of the fingers and the electrodes when packaging the semiconductor device.

As explained above, the insulating layer functions to support the fingers and is, therefore, capable of preventing deformation of the finger which is an obstacle in terms of narrowing pitch between the as-used fingers. Hence, the finger pitch can be ameliorated by employing the conductive pattern including the insulating layer. Packaging of an IC chip having hyperfine electrode strings can be facilitated. In addition, an auxiliary circuit for inter-electrode connections can also be formed in a conductive pattern including a single-layered conductive layer and insulating layer. Packaging density on the circuit substrate is thereby improved.

FIGS. 14A-D, 15A-D and 16 in combination show one example of steps for manufacturing the conductor pattern used in the semiconductor device of this embodiment. Note that the steps 1 to 3 are the same as the conventional ones described above, and the explanation thereof is omitted. A general description about step 4 and subsequent ones will be given.

Step 4: A resist layer 14 is formed on a copper foil laminated on the polyimide tape 10. Thereafter, the resist 14 is removed by lithography while a finger unit 14a and a through-hole unit 14b are left. A protective resist 16 is applied on a rear face of the tape 10 (FIG. 14A).

Step 5: A first layer finger unit 13a and a through-hole unit 13b are formed by etching, and a resist is removed (14B).

Step 6: Photopolyimide is applied using a roll coat method shown in FIG. 16 on a copper layer 13 formed with the first layer finger unit 13a and the through-hole unit 13b. A polyimide layer 111 is thus formed (FIG. 14C). Based on the roll coat method, as illustrated in FIG. 16, photopolyimide in a resin vessel 103 is continuously applied on the surface of the tape 10 by means of two rollers 101, 102.

Step 7: Polyimide of a portion 111a corresponding to the through-hole is removed from the polyimide layer 111 by lithography (FIG. 14D).

Step 8: A thin film copper layer 112 is formed on the portion 111a corresponding to the through-hole as well as on the polyimide layer 111 by a sputtering method or a field-free plating method (FIG. 15A).

Step 9: The second layer finger unit is separately formed. For this purpose, a resist layer 113 is formed by lithography substantially at the center of the device hole 15 on the thin film copper layer 112 (FIG. 15B).

Step 10: A second layer finger unit 114 is formed on the thin film copper layer 112 by field plating. The resist layer 113 is then removed (FIG. 15C).

Step 11: The second layer finger unit 114 is separated. For this purpose, the thin film copper layer 112 on the device hole 15 is removed by light etching. Thereafter, the protective resist layer 16 is exfoliated. The conductor pattern of this embodiment can be thus manufactured (FIG. 15D).

As described above, in this embodiment the copper layer is formed on the polyimide tape to obtain a wiring pattern by lithography. Furthermore, the insulating layer is continuously formed on this wiring pattern by the roll coat method. A wiring pattern is further formed thereon. Based on the same method, a conductor pattern of four or more layers can be manufactured without being limited to the 3-layered structure.

Embodiment 3

FIGS. 17 and 18 show the semiconductor device including a multi-layered conductor pattern in a third embodiment. The IC chip mounted in this embodiment has, as in embodiment 2, two electrode strings 211, 212. The components are marked with the same numerals, and the description thereof is omitted. A conductor pattern 310, in this embodiment, is formed on a rear face 10b of the polyimide tape 10. The conductor pattern 310 has a 5-layered structure, i.e., it consists of a first conductive layer 301, an infra-formed polyimide insulating layer under this conductive layer 301, an infra-formed second conductive layer under this insulating layer 302, an insulating layer 304 formed on the first conductive layer 301 within a device hole 15, and a shield conductive layer 305 formed on this insulating layer 304.

The conductive layer 301 is formed with a first layer finger unit 311 connected to the inner electrode string 212a. The tip of this finger unit 311 is connected via a bump 321 to the electrodes 212a. The bump 321 is formed as high as a total thickness of the second conductive layer 303 and the insulating layer 302. Namely, the bump 321 serves to secure an electrification path in a thickness-wise direction of the conductive pattern 310 from the finger unit 311 to the electrodes 212a. The conductive layer 303 is formed with a second layer finger unit 313 connected to the outer electrode string 211a. The tip of this finger unit 313 is connected via a lower bump 322 to the electrodes 211a.

In this embodiment, the conductive layer 305 is formed on the conductive layer 301 through the insulating layer 304. This conductive layer 305 is a thin film layer composed of copper and functions to shield the IC chip 20. The conductive layer 305 is connected in ground wiring to an unillustrated circuit substrate through fingers 317 shaped on the surface 10a of the tape 10.

In the semiconductor device according to this embodiment, an electrification path is formed in the thickness-wise direction of the conductor pattern by use of the bumps in place of the through-hole used in embodiment 2. Based on the multi-layered conductor pattern, as in embodiment 2, the multi-pinned IC chip can be packaged on the circuit substrate in the same manner as a conventional chip. Besides, in this embodiment, the shield is formed by use of a single layer of the multi-layered conductor pattern. A shield plate which has hitherto been shaped on the circuit substrate can be omitted. Hence, the device can also be packaged in a circuit substrate region allocated to the shield plate. The packaging density can be further improved.

Note that in this embodiment the shield is formed by a single layer of the multi-layered conductor pattern, however, it is possible to prepare wires for connecting the electrodes on the chip or connecting the circuits on the substrate. As a matter of course, the conductor pattern is multi-layered, viz., structured to have 5 or more layers. A plurality of connecting circuits and a shield structure can be simultaneously obtained. Furthermore, another chip is also connectable on the multi-layered conductor pattern including these connecting circuits.

EMBODIMENT 4

FIGS. 19 through 23 in combination show the semiconductor device in a fourth embodiment. Connected by use of a 2-layered conductive pattern in the semiconductor device of this embodiment are two strings of electrodes 211a, 211b, 212a, 212b, a single string of electrodes 211c, 211d which are prepared on the IC chip 20, two strings of wires 43a, 43b, 43e, 43f, and a single string of wires 43c 43d which are prepared on the substrate 40.

FIG. 19 illustrates how the device in this embodiment is formed on a polyimide tape. FIG. 20 shows a state where the device is packaged on the substrate 40. The conductive pattern in this embodiment is composed of first layer wiring patterns 301a, 301b, 301c, 301d, and second layer wiring patterns 303a, 303b, 303c, 303d.

To start with, as illustrated in FIG. 21, the electrodes 211a, 212a are connected to the wires 43b, 43a, respectively. The electrode 211a is connected via a through-hole 314 and the first wiring pattern 301a to the wire 43b. The electrode 212a is connected via the through-hole 314 to the second layer wiring pattern 303a and further connected to the wire 43a through the pattern 303a.

The electrodes 211b, 212b are connected to the wires 43d, 43c, respectively. The electrode 211b is, as shown in FIG. 22, connected to the first wiring pattern 301b. This pattern 301b is bent in a direction orthogonal to the pattern 303c and connected via the through-hole 314 to the second layer pattern 303c. The pattern 301b is connected through this pattern 303c to the wire 43d. On the other hand, the electrode 212b is connected via the through-hole 314 to the second layer pattern 303b. This pattern 303b is in turn connected to the wire 43c.

The electrode 211c is at first, as illustrated in FIG. 23, linked to the first layer pattern 301c. This pattern 301c is connected via the through-hole 314 to the second layer pattern 303d. Further, the pattern 303d is bent towards the pattern 301d and is, after being confluent with the pattern 301d, connected to the wire 43f via the same route with the pattern 301d. On the other hand, the electrode 211d is connected to the first layer wiring pattern 301d and further connected via the through-hole 314 to the wire 43e.

In accordance with this embodiment, an interface between the IC chip 20 and the substrate 40 is constructed by use of the through-hole in the connecting parts to the electrode and the wire as well as in the mid-portion of the wiring pattern. With this arrangement, even if the wires of the packaging substrate do not necessarily correspond to the placement of the electrode string on the IC chip, the chip can be easily packaged by employing the multi-layered conductive pattern of this embodiment. Hence, the IC chip and the packaging substrate can be placed and designed independently. Optimal placement, wiring and design can be effected independently.

Note that in the embodiments 1 to 4, the polyimide tape is used as a flexible substrate, but the substrate may be composed of a glass epoxy tape. An epoxy resin is, as a matter of course, usable for an insulating layer.

As discussed above, in the semiconductor device according to this invention, the multi-layered conductive pattern including the insulating layer is connected to the semiconductor integrated circuit. Even a multi-pinned semiconductor integrated circuit having a plurality of electrode strings can be safely, easily, packaged on the circuit substrate in the same manner as in the prior art. Moreover, a plurality of semiconductor integrated circuits can be simultaneously packaged on the circuit substrate by employing the conductive pattern of this invention. A circuit substrate with a high packaging density can thus be manufactured. An auxiliary circuit, such as a shield, can be formed in the conductor pattern, and hence an area on the circuit substrate is effectively utilized. Further, this makes it possible to improve the packaging density.

INDUSTRIAL APPLICABILITY

As discussed above, the semiconductor device according to this invention is formed with a multilayered conductive pattern. This semiconductor device is effective particularly when manufacturing a circuit substrate exhibiting high packaging density using the tape carrier method. The circuit, which has hitherto been formed by use of the circuit substrate, can be realized based on the multi-layered conductive pattern. A variety of interfaces between IC chips and packaging substrates can be readily shaped, thereby being applicable to a variety of situations corresponding to the applications of the circuit substrate.

What is claimed is:

1. A semiconductor device comprising:
    a multi-layer interconnection structure arranged on a substrate comprising
    a first layer of first electrically conducting fingers,
    a second layer of second electrically conducting fingers, and
    an electrically insulating material arranged between said first and second layers; and
    a second interconnection structure arranged on the substrate comprising a plurality of third electrically conducting fingers,
    said first electrically conducting fingers of said multi-layer interconnection structure being in electrical communication with corresponding first electrodes of a first integrated circuit, said second electrically conducting fingers of said multi-layer interconnection structure being in electrical communication with corresponding first electrodes of a second integrated circuit, and said third electrically conducting fingers of said second interconnection structure being in electrical communication with corresponding second electrodes of the first and second integrated circuits.

2. The semiconductor device of claim 1 wherein opposite ends of said first, second and third fingers extend beyond said substrate and are configured in a non-overlapping pattern.

3. The semiconductor device of claim 1 further comprising an electrically conductive path extending in a thickness-wise direction between and connected to said first and second layers.

4. The semiconductor device of claim 3 wherein at least one of said first and second fingers on said substrate is connected to said electrically conductive path and through it to one end of a conductor residing in an upper layer of said multi-layer interconnection structure.

5. The semiconductor device of claim 3 wherein said electrically conductive path comprises an electrically conductive through-hole.

6. The semiconductor device of claim 3 wherein said electrically conductive path comprises an electrically conductive bump.

7. The semiconductor device of claim 1 wherein said insulating layer comprises a polyimide layer.

8. The semiconductor device of claim 1 wherein said insulating layer comprises material deposited between conductive layers by roll-forming.

9. The semiconductor device of claim 1 further comprising a film-like flexible substrate having a device mounting aperture formed on one surface for receiving said semiconductor substrate which is mounted therein.

10. The semiconductor device of claim 9 wherein said flexible substrate comprises polyimide tape.

11. The semiconductor device of claim 9 wherein said insulating layer comprises material deposited between conductive layers by roll-forming.

12. The semiconductor device of claim 9 wherein said insulating layer comprises a polyimide layer.

13. The semiconductor device of claim 1 wherein said multi-layered interconnection structure is formed with at least one guidance aperture for use in aligning ends of said conductors said electrodes on said substrate.

14. The semiconductor device of claim 1, wherein said multi-layer interconnection structure is arranged at a first side of the first and second integrated circuits and said second interconnection structure is arranged at an opposite side of the first and second integrated circuits.

15. The semiconductor device of claim 14, wherein said first electrically conducting fingers are substantially disposed on a first plane and said second and third electrically conducting fingers are substantially disposed on a second plane.

16. The semiconductor device of claim 14, wherein said first, second and third fingers are arranged between the first and second integrated circuits.

17. The semiconductor device of claim 1, wherein said first and second and fingers are arranged such that the first and second integrated circuits are individually accessable, respectively.

18. The semiconductor device of claim 1, wherein said first fingers are electrically insulated from the second fingers.

* * * * *

UNITED STATES PATENT AND TRADEMARK OFFICE
CERTIFICATE OF CORRECTION

PATENT NO. : 5,313,367
DATED : May 17, 1994
INVENTOR(S) : Hisanobu Ishiyama

It is certified that error appears in the above-identified patent and that said Letters Patent is hereby corrected as shown below:

The title page should be deleted, to appear as per attached title page.

The sheets of drawings consisting of figures 1, 2, 6, 8, 17 and 19 should be deleted to appear as per attached sheets.

Signed and Sealed this

Twenty-fifth Day of July, 1995

*Attest:*

BRUCE LEHMAN

*Attesting Officer*   Commissioner of Patents and Trademarks

United States Patent

Ishiyama

[11] Patent Number: 5,313,367
[45] Date of Patent: May 17, 1994

[54] SEMICONDUCTOR DEVICE HAVING A MULTILAYER INTERCONNECTION STRUCTURE

[75] Inventor: Hisanobu Ishiyama, Suwa, Japan
[73] Assignee: Seiko Epson Corporation, Tokyo, Japan
[21] Appl. No.: 836,285
[22] PCT Filed: Jun. 11, 1991
[86] PCT No.: PCT/JP91/00786
§ 371 Date: Apr. 21, 1992
§ 102(e) Date: Apr. 21, 1992
[87] PCT Pub. No.: WO92/00603
PCT Pub. Date: Jan. 9, 1992

[30] Foreign Application Priority Data
Jun. 26, 1990 [JP] Japan .................. 2-167371

[51] Int. Cl.⁵ .................. H01R 9/00; H01R 43/00
[52] U.S. Cl. .................. 361/772; 29/827;
228/180.22; 257/735; 257/736; 257/777;
361/760; 361/761; 361/773; 439/69
[58] Field of Search .................. 29/827, 174/52.4,
228/180.2, 180.22, 257/668, 669, 723, 724, 777,
778, 735, 736; 361/396, 400, 401, 421, 760, 761,
762, 767, 768, 772, 773, 774, 807, 808; 439/68,
69; 437/182, 203, 205

[56] References Cited

U.S. PATENT DOCUMENTS

| 4,051,274 | 9/1977 | Hata et al. .................. 427/172 |
| 4,912,547 | 3/1990 | Bilowith et al. .................. 257/778 |
| 5,021,866 | 6/1991 | Sudo et al. .................. 257/669 |

FOREIGN PATENT DOCUMENTS

| 343400 | 11/1989 | European Pat. Off. |
| 0461639 | 12/1991 | European Pat. Off. .................. 257/777 |
| 0474224 | 3/1992 | European Pat. Off. .................. 257/777 |
| 52-84969 | 7/1977 | Japan . |
| 55-6852 | 1/1980 | Japan . |
| 58-159361 | 9/1983 | Japan .................. 257/777 |
| 60-46040 | 3/1985 | Japan . |
| 60-80232 | 5/1985 | Japan .................. 257/777 |
| 61-225825 | 10/1986 | Japan .................. 437/205 |
| 62-67828 | 3/1987 | Japan . |
| 62-158339 | 7/1987 | Japan .................. 257/777 |
| 63-52461 | 3/1988 | Japan .................. 257/777 |
| 63-164229 | 7/1988 | Japan . |
| 1-108934 | 7/1989 | Japan . |
| 1-303730 | 12/1989 | Japan .................. 257/777 |
| 2-142151 | 5/1990 | Japan .................. 257/724 |

OTHER PUBLICATIONS

IBM Technical Disclosure Bulletin "Method for Manufacturing a Low-Cost Power Regulator Card" vol. 32, No. 7, Dec. 1989.

*Primary Examiner*—Leo P. Picard
*Assistant Examiner*—Donald A. Sparks
*Attorney, Agent, or Firm*—Eric B. Janofsky

[57] ABSTRACT

Actualized are fingers through which a semiconductor integrated circuit including high density electrode strings can be easily safely mounted on a circuit substrate in the same manner with the prior art. A conductor pattern capable of improving a packaging density of the integrated circuit including the fingers is actualized. The fingers are therefore configured using the multilayered conductor pattern. The conductor pattern is multi-layered, i.e., consists of conductive layers and an insulating layer for separating these conductive layers. In addition to a wiring pattern serving as fingers for connecting an integrated circuit to a packaging substrate, an electrification path for interlayer connections is also formed in a thickness direction. The circuit substrate exhibiting a high packaging density can be actualized.

18 Claims, 11 Drawing Sheets

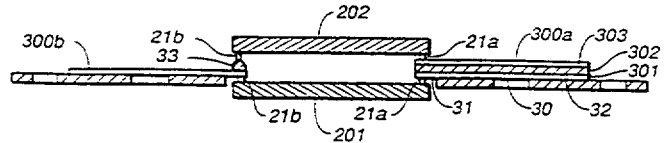

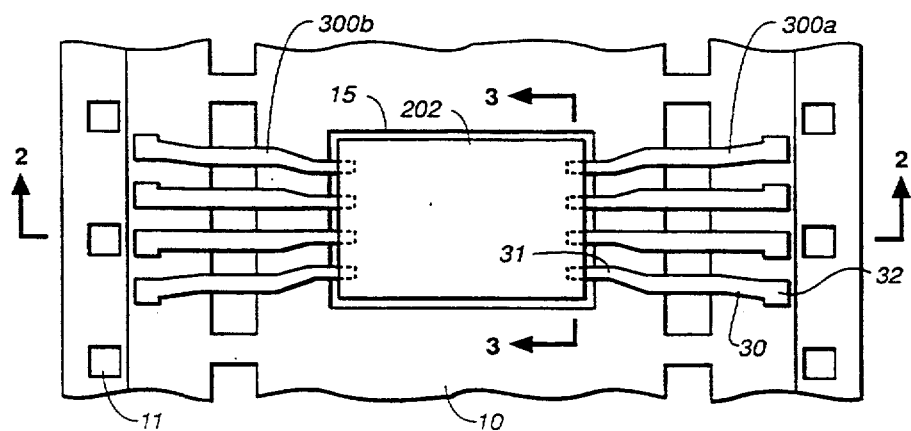
FIG._1
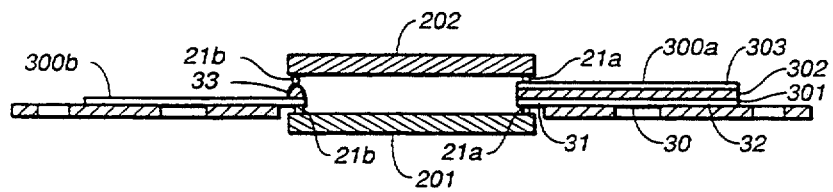
FIG._2
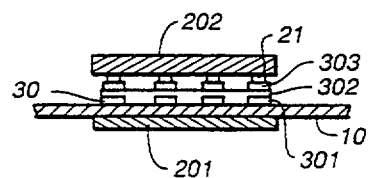
FIG._3

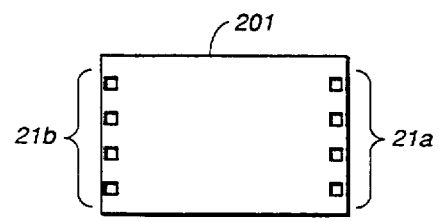
FIG._4
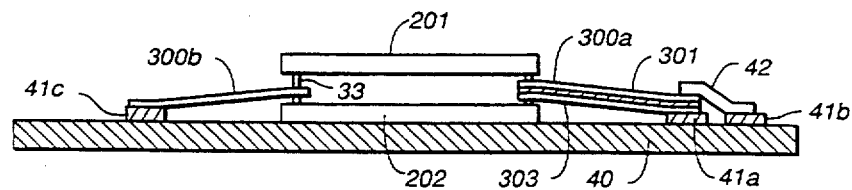
FIG._5
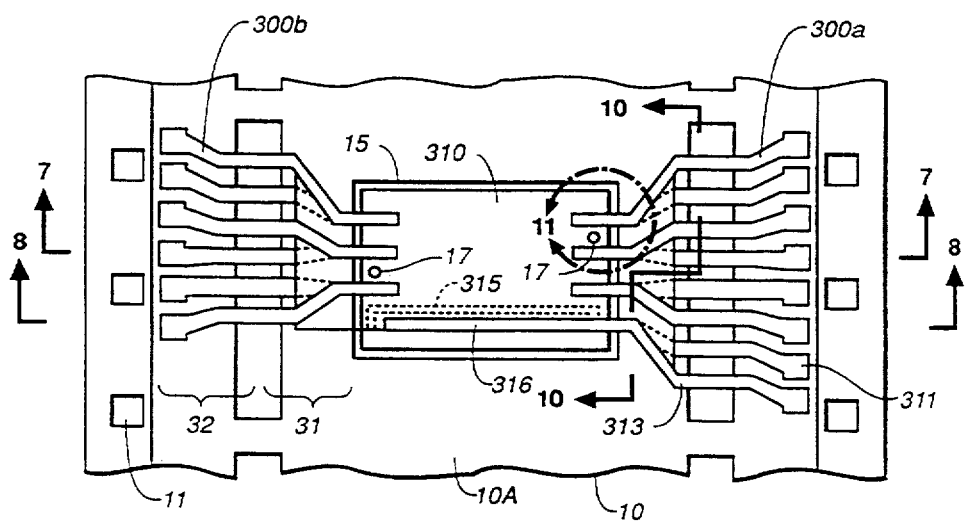
FIG._6

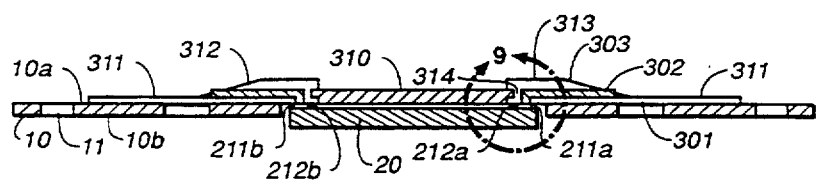
FIG._7
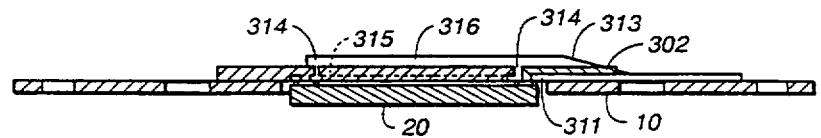
FIG._8
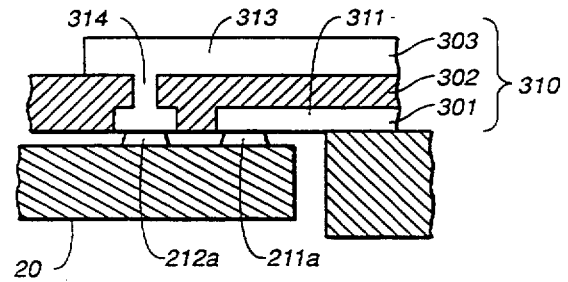
FIG._9
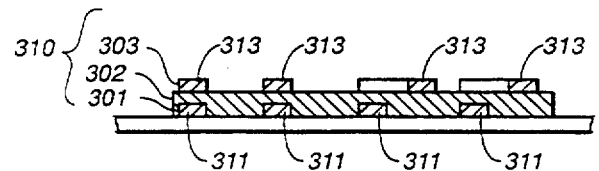
FIG._10

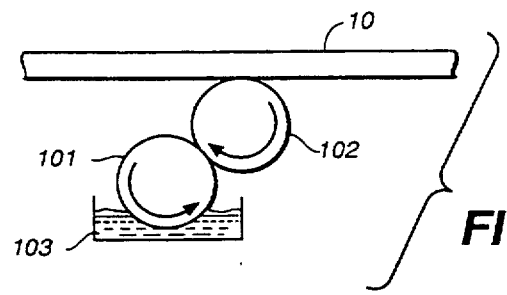
FIG._16
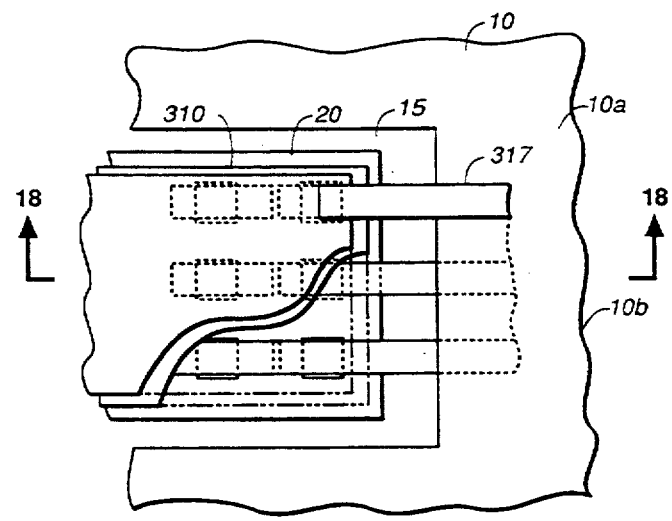
FIG._17
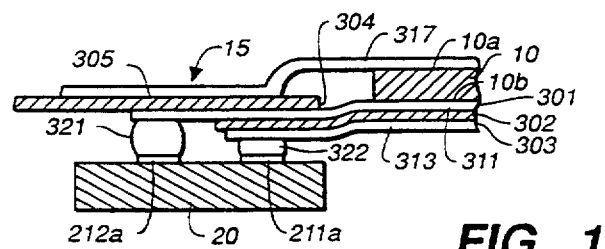
FIG._18

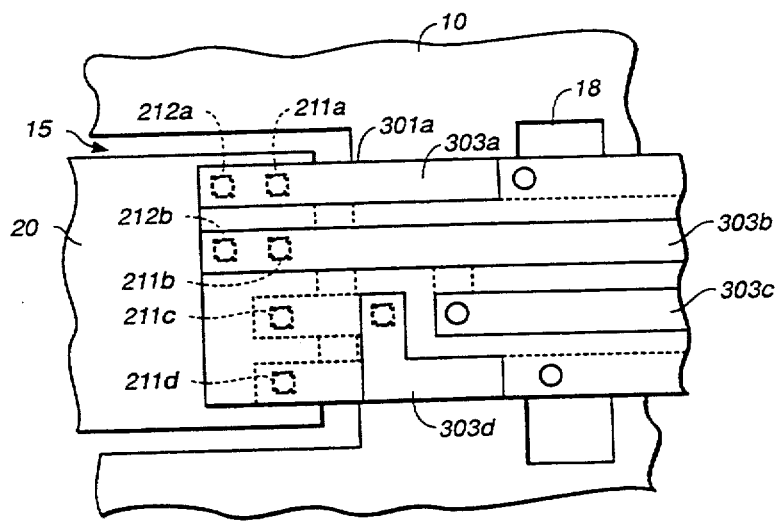
FIG._19
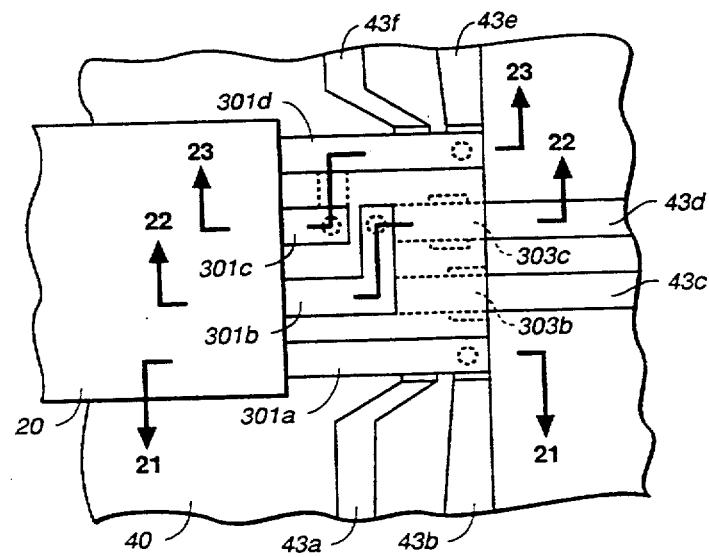
FIG._20